(12) United States Patent
Chong et al.

(10) Patent No.: US 10,978,141 B1
(45) Date of Patent: Apr. 13, 2021

(54) CONFIGURABLE INTEGRATED CIRCUITS

(71) Applicant: Arm Limited, Cambridge (GB)

(72) Inventors: Yew Keong Chong, Austin, TX (US);
Sriram Thyagarajan, Austin, TX (US);
Andy Wangkun Chen, Austin, TX (US); Vivek Asthana, Noida (IN);
Munish Kumar, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/698,851

(22) Filed: Nov. 27, 2019

(51) Int. Cl.
*G11C 11/418* (2006.01)
*G11C 11/417* (2006.01)
*G11C 11/419* (2006.01)

(52) U.S. Cl.
CPC .......... *G11C 11/418* (2013.01); *G11C 11/417* (2013.01); *G11C 11/419* (2013.01)

(58) Field of Classification Search
CPC .... G11C 11/418; G11C 11/417; G11C 11/419
USPC .............. 365/230.06, 48, 55, 62, 66, 74, 78, 365/80–93, 100, 130, 131, 148, 158, 365/171–173, 209, 213, 225.5, 230.07, 365/232, 243.5
See application file for complete search history.

(56) References Cited

U.S. PATENT DOCUMENTS

| | | | | |
|---|---|---|---|---|
| 7,590,015 | B2* | 9/2009 | Kodaira | G11C 29/806 365/200 |
| 9,299,395 | B2* | 3/2016 | Kulkarni | G11C 11/412 |
| 2007/0242518 | A1* | 10/2007 | Seidel | G11C 16/3454 365/185.22 |

* cited by examiner

*Primary Examiner* — Harry W Byrne
(74) *Attorney, Agent, or Firm* — Pramudji Law Group PLLC; Ari Pramudji

(57) ABSTRACT

According to one implementation of the present disclosure, an integrated circuit includes first and second word-line decoder circuitry, two or more memory instances coupled to the first and second word-line decoder circuitry; and a control block circuitry coupled to the first and second word-line decoder circuitry and the two or more memory instances. Also, a pin bus enabled in the control block circuitry may be configured to at least partially control selection of one or more of the two or more memory instances.

20 Claims, 6 Drawing Sheets

CONFIGURABLE INTEGRATED CIRCUITS

I. FIELD

The present disclosure is generally related to configurable integrated circuit devices.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. For such devices, there is an ever-increasing demand for greater efficiency in power, performance, and area (PPA) for memory storage capacity and read/write capabilities.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

Advantageously, inventive aspects of the present invention allow for power, performance, area (PPA) optimized memory configurations of single port and dual port memories. Moreover, in various cases, programming updates for each of the configurations may be solely of a single type.

Figure 2:
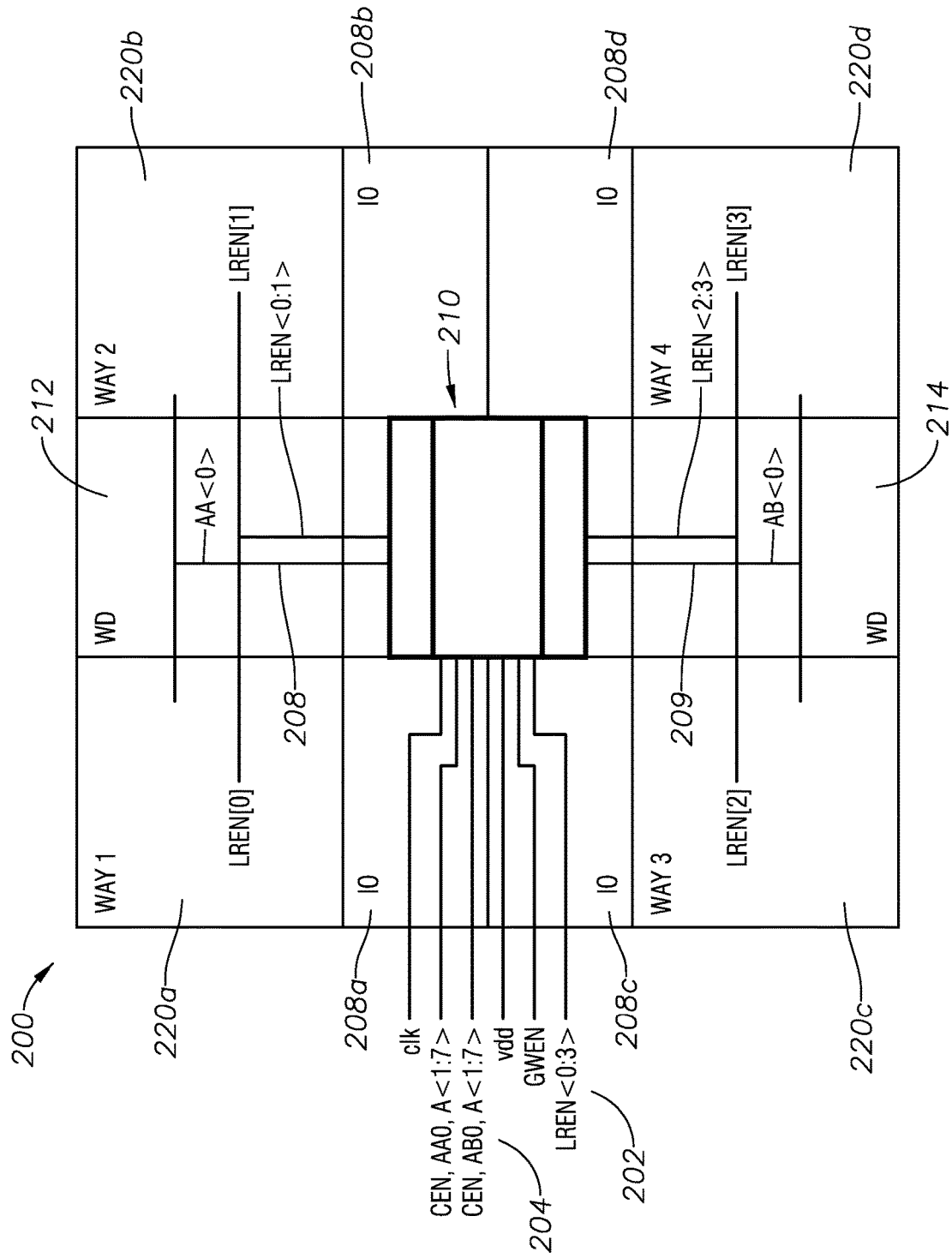
FIG. 2 is a schematic diagram of an integrated circuit in accordance with various implementations described herein.
Figure 2:
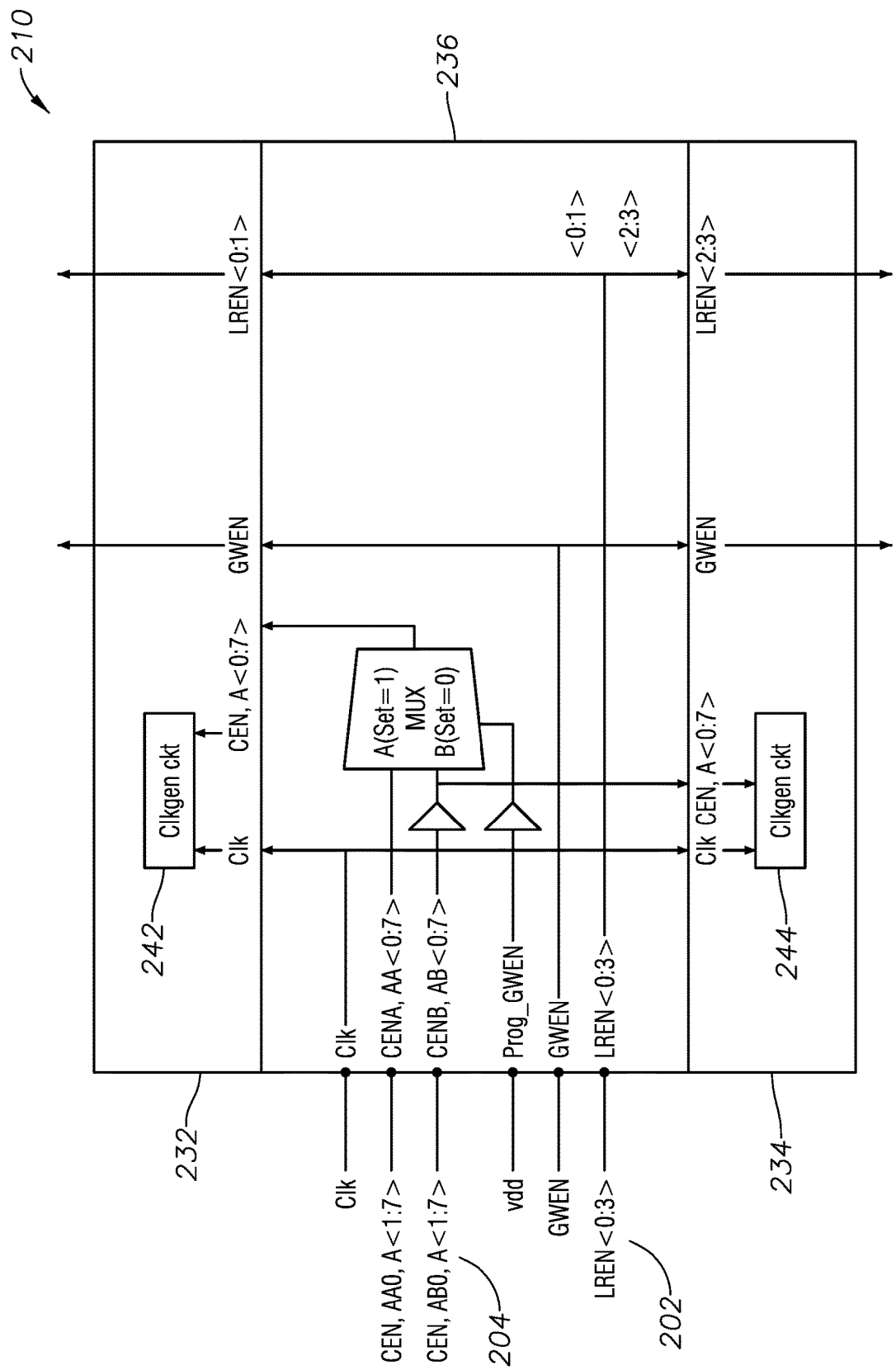
Figure 3:
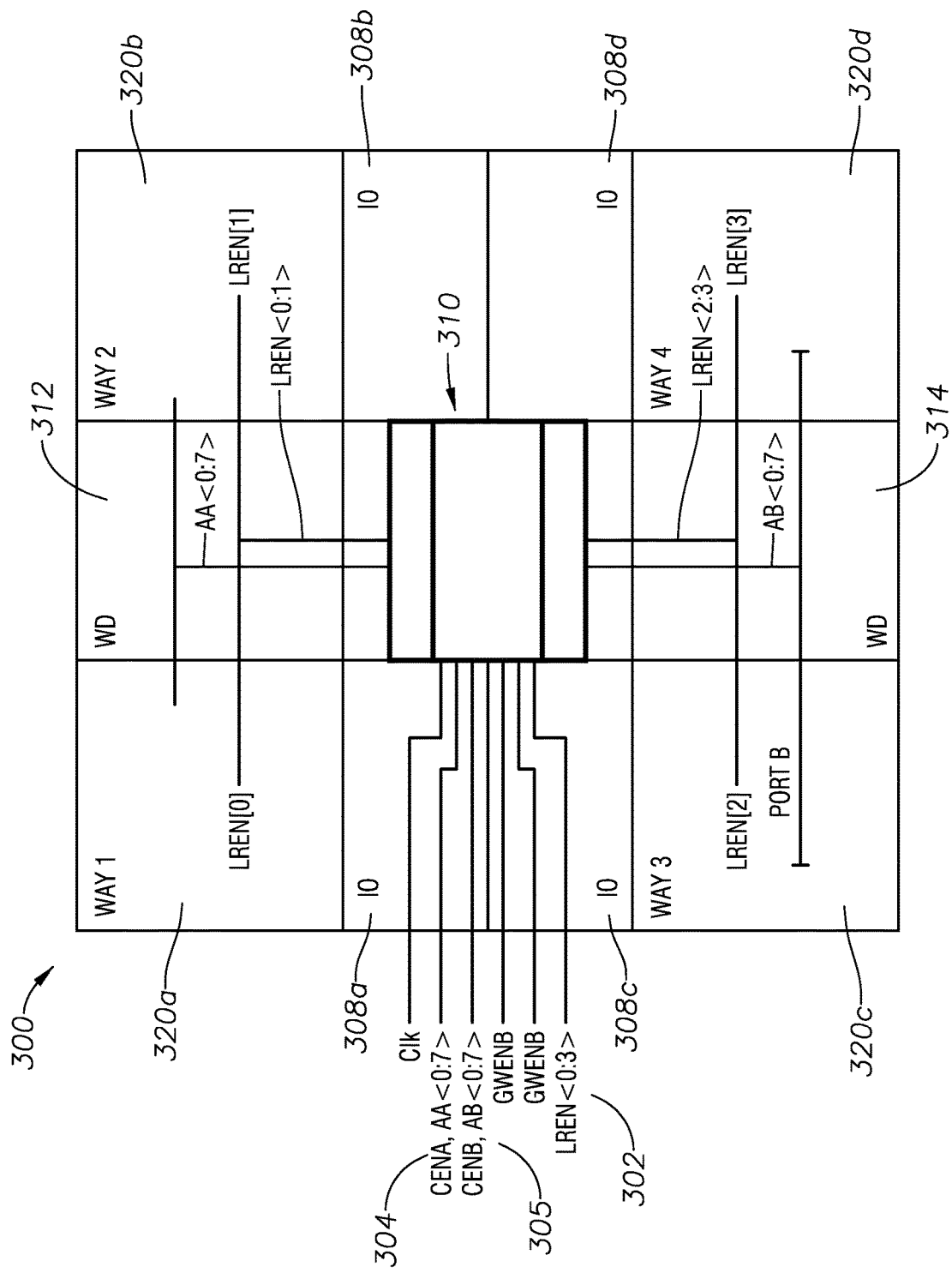
FIG. 3 is a schematic diagram of an integrated circuit in accordance with various implementations described herein.
Figure 3:
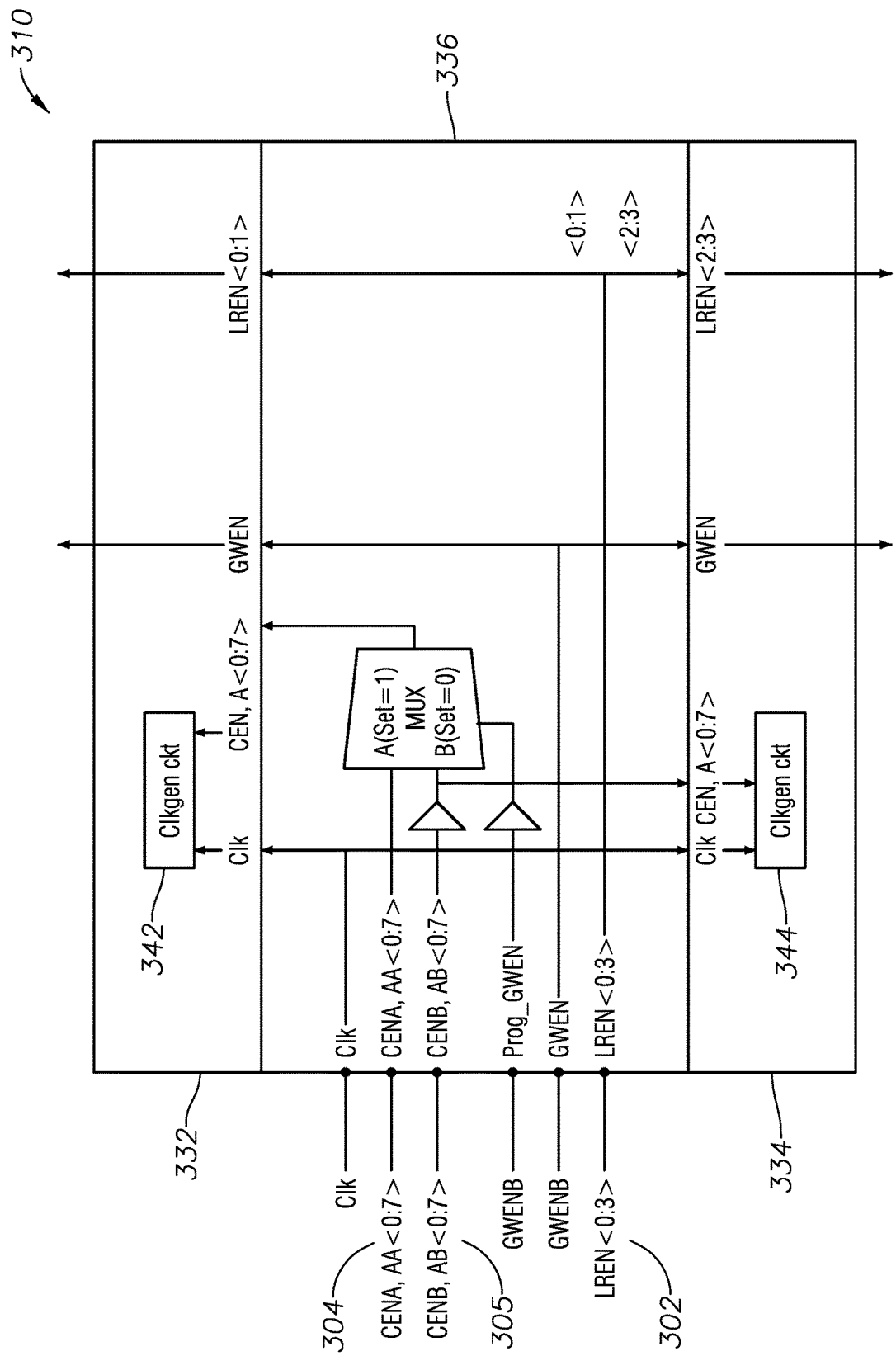

Accordingly, in various schemes and techniques, as described herein, the inventive aspects allow for the capacity of a single port memory architecture to be configured at "pin-level" to act as any one of the following: 1) a single port combined two or four-way left-right enable (LREN) controlled memory (FIG. 1); 2) a single port two or four-way combined LREN controlled memory with independent address (FIG. 2); and 3) a combined two-port memory such as a one read port-one read/write port (1R/1RW) (FIG. 3).

In one example implementation, for the single port combined two or four-way left-right enable (LREN) controlled memory, selection of a particular memory location is performed by a single 8-pin address bus and 2-pin/4-pin pin bus. In another example implementation, for the single port two or four-way combined LREN controlled memory with independent address, selection of a particular memory location is performed by a single 8-pin address bus (with at least one different bit) and 2-pin/4-pin pin bus. In a third example implementation, for a combined two-port memory such as a one read port-one read/write port (1R/1RW), selection of a particular memory location and read and read/write operations are performed by one of two different address buses and a 2-pin/4-pin pin bus.

In exemplary aspects, various single port tile cells may be reused with a minimum requirement of two separate tiles. Accordingly, such tile programming would allow for the memory architecture configurations as described herein. As one particular advantage, the schemes and techniques may be autonomous and software-agnostic, and allow for improvements in power, performance, area (PPA). Accordingly, as combined memory implementations, such schemes and techniques may obviate requirements such as redundant/separate word-line decoder circuitries and redundant/separate control block circuitries.

Advantageously, the inventive aspects, in various implementations, prevent: area loss due to duplication of complete memory instances (e.g., duplication of all cells including edge cells); area and power loss due to external logic to manage address buses and a global write enable signal; and excessive access time as a result of single-ended read operations.

Figure 1:
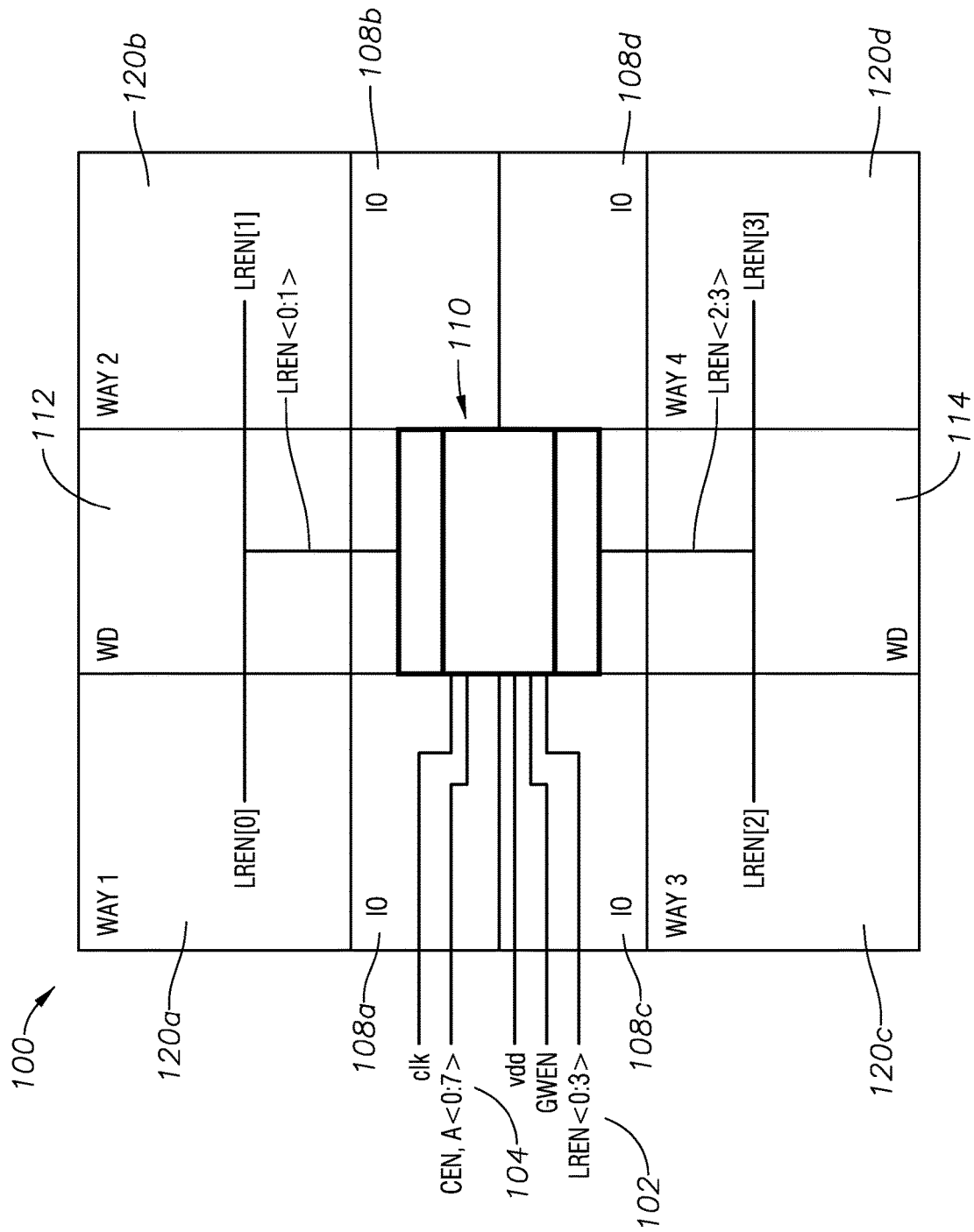
FIG. 1 is a schematic diagram of an integrated circuit in accordance with various implementations described herein.
Figure 1:
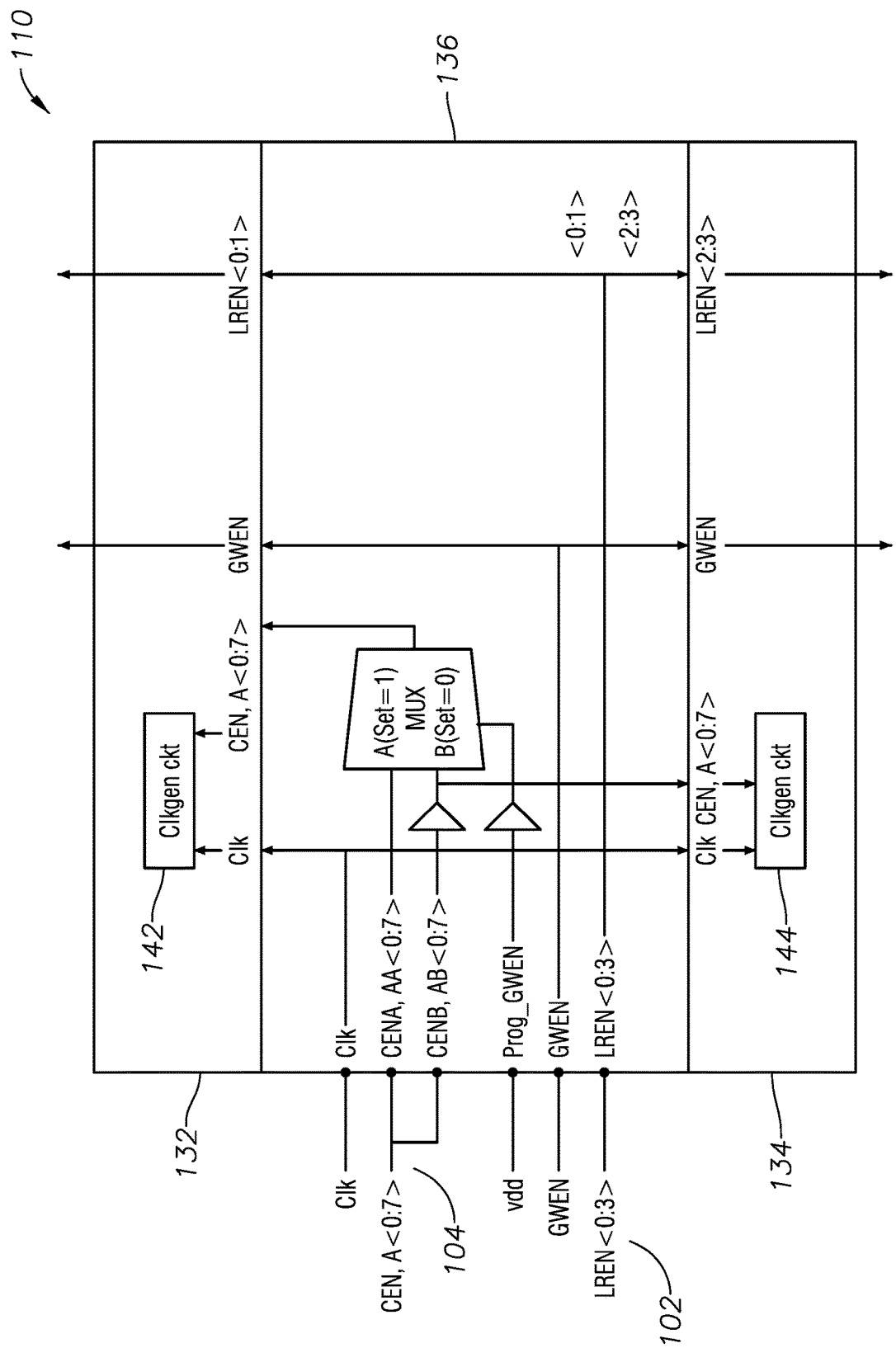

Referring to FIG. 1, an example integrated circuit 100 (i.e., two or more memory macros including memory arrays (e.g., static-random access memory (SRAM)), implementable on a system-on chip (SoC), a two or four-way LREN combined-instance) is shown. As depicted in FIG. 1, the integrated circuit 100 may include first and second word-line decoder blocks (i.e., first and second word-line decoder circuitries) 112, 114, two or more memory instances 120*a*, 120*b*, etc. (i.e., two or four-memory core arrays, memory banks, memory blocks, 2 or 4 "Ways") and a control block circuitry (i.e., a central block) 110 coupled to the first and second word-line decoder blocks 112, 114 and the two or more memory instances 120*a*, 120*b*, etc. Moreover, as shown, a pin bus 102 (i.e., either a two-pin or four-pin left-right enable bus) (e.g., LREN<0:1>, LREN<0:3>) (e.g., selection signal on the LREN pin bus) enabled in the control block circuitry 110 may be configured to at least partially control selection (e.g., access) of one or more of the two or more memory instances 120*a*, 120*b*, etc. As illustrated in FIG. 1, in one implementation, a 4-way LREN bus 102 may be used to at least partially control selection of first, second, third, and fourth memory instances 120a, 120b, 120c, and 120d.

Advantageously, as shown in one example illustration in FIG. 1, the two memory instances (e.g., 120a, 120b) or four memory instances (e.g., 120a, 120b, 120c, and 120d) may include a common (i.e., single) address bus 104 (e.g., A<0:7>) that can be utilized for a two or four-way LREN combined-instance (i.e., the integrated circuit 100). Such an integrated circuit 100 may provide 12-20% improvement in dynamic power, 10-20% improvement in area, and a less than 2% penalty in timing. In a particular example, the integrated circuit may be used in power, performance, and area improvements in, for example, L1 cache.

In one implementation (not shown), the two or more memory instances 120a, 120b may include first and second memory instances 120a, 120b. In such an implementation, the first word-line decoder block 112 may be coupled to the first and second memory instances 120a, 120b. Moreover, the pin bus 102 would be a two-pin bus (e.g., left-right enable (LREN[0],[1])). In another implementation, as illustrated in the example of FIG. 1, the two or more memory instances 120a, 120b may include first, second, third, and fourth memory instances 120a, 120b, 120c, 120d. In such an implementation, the first word-line decoder block 112 may be coupled to the first and second memory instances 120a, 120b, while the second word-line decoder block 114 may be coupled to the third and fourth memory instances 120c, 120d. Moreover, the pin bus 102 would be a four-pin bus (e.g., left-right enable (LREN <0:3>; LREN[0],[1],[2],[3])).

In certain aspects, the example integrated circuit 100 may further include two or more input/output circuits (i.e., I/O ports) (108a, 108b, etc.) respectively coupled to the at least two memory instances (120a, 120b, etc.). In various implementations, each of the I/O circuits 108a, 108b, etc. may include a respective write driver, sense amplifier, pre-charge circuit, multiplexer, and D input and Q output latches. In one example implementation, the two or more I/O ports include first and second I/O ports 108a, 108b. In such an example, the first and second I/O ports 108a, 108b are respectively coupled to first and second memory instances 120a, 120b. In another implementation, as shown in FIG. 1, the two or more I/O ports include first, second, third, and fourth I/O ports 108a, 108b, 108c, 108d that may be respectively coupled to the first, second, third, and fourth memory instances 120a, 120b, 120c, and 120d.

In certain implementations, each of the first and second word-line decoder blocks (circuitries) 112, 114 may include a word-line post decoder and driver circuits. In a particular case, the word-line decoder blocks (circuitries) 112, 114 may be configured to select word-lines coupled to the memory instances (120a, 120b, etc.) based on the control signals generated by the control block 110.

In certain schemes, with reference to FIG. 1, the control block circuitry 110 may be configured for the selection of one or more of the memory instances 120 (e.g., 120a, 120b, etc.) In certain aspects, the control block circuitry 110 may include a first control section 132 including a first clock generation block 142, a second control section 134 including a second clock generation block 144, and a configuration control logic section 136. In one example, with two memory instances, 120a, 120b, the first control section 132 may be a control sub-block for both the memory instances 120a, 120. In another example, as shown in FIG. 1, with four memory instances, 120a, 120b, 120c, 120d, the first control section 132 may be a control sub-block for the first and second memory instances 120a, 120b, while the second control section 134 may be a control sub-block for the third and fourth memory instance 120c, 120d.

In the implementation of circuit 100, as shown in FIG. 1, the control block circuitry 110 may include various input signals/lines including: a clock signal (Clk), a chip enable signal (CEN) and address pins 104 (A<0:7>), a supply voltage signal (vdd), a global write enable signal (GWEN), and a (left-right enable) selection signal on the pin bus 102 (LREN <0:3>). Moreover, as shown in FIG. 1, the control block circuitry 110 may also include output signals including: the GWEN and LREN <0,1> (input into the first and second memory instances 120a, 120b), and the GWEN and LREN <1,2> (input into the third and fourth memory instances 120c, 120d).

In this manner, in one particular operation, via the control block circuitry 110, the two or more memory instances (either two or four memory blocks 120a-b, 120a-d in different implementations) may be coupled and configured to be at least partially controlled by one or both of the common chip enable pin and address bus 104 (CEN, A<0:7>) and the pin bus 102 (LREN <[0:3]>). Also, for such an operation, corresponding to a particular implementation with reference to FIG. 1, the common chip enable pin and address bus 104 (CEN, A<[0:7]>) may include identical address pins that correspond to identical address bits (e.g., the same address, byte, 8-bit address bus: A[0:7]).

Referring to FIG. 2, an example integrated circuit 200 (i.e., two or more memory macros including memory arrays (e.g., static-random access memory (SRAM)) implementable on a system-on chip (SoC), as collectively: the two or four LREN instance) is shown. As depicted in FIG. 2, the integrated circuit 200 may include first and second word-line decoder blocks (i.e., first and second word-line decoder circuitries) 212, 214, two or more memory instances 220a, 220b, etc. (i.e., two or four-memory core arrays, memory banks, memory blocks, 2 or 4 "Ways") and a control block circuitry (i.e., a central block) 210 coupled to the first and second word-line decoder blocks 212, 214 and the two or more memory instances 220a, 220b, etc. As shown, a pin bus 202 (i.e., either a two-pin or four-pin left-right enable (LREN) bus) (e.g., LREN<0:1>, LREN<0:3>) (e.g., selection signal on the LREN pin bus) enabled in the control block circuitry 210 may be configured to at least partially control selection (e.g., access) of one or more of the two or more memory instances 220a, 220b, etc. As illustrated in FIG. 2, in one implementation, a 4-way LREN bus 202 may be used to at least partially control selection of first, second, third, and fourth blocks 220a, 220b, 220c, and 220d.

Advantageously, as shown in one example illustration in FIG. 2, the two memory instances (e.g., 220a, 220b) or four memory instances (e.g., 220a, 220b, 220c, and 220d) may include a common address bus 204 (e.g., A<1:7>, where 7 bits may be the same) having one address bit different (e.g., AB<0> or AA<0>) that can be utilized for a two or four-way LREN combined-instance (i.e., the integrated circuit 200) with independent address (access). For instance, in one example, with reference to FIG. 2, the control block 210 may include the same address bus 204 (with two one address bit different) as two separate input puns. Externally, however, these two separate input pins are coupled to the common address bus 204 (e.g., A<1:7>). Hence a user/designer may be able to distinguish between the different memory instances by changing the last bit of the address. Accordingly, such user/designer's have the capacity to access different parts of the memory through different one particular address bit. Such an integrated circuit 200 may provide a greater than 10% improvement in area (due to extraneous routing and periphery cells), as well as improvements in power usage along with a reduction in routing congestion. Furthermore, in other examples, more than one address bit may be different for accessing various memory instances of the integrated circuit 200.

In one implementation (not shown), the two or more memory instances 220a, 220b may include first and second memory instances 220a, 220b. In such an implementation, the first word-line decoder block 212 may be coupled to the first and second memory instances 220a, 220b. Moreover, the pin bus 202 would be a two-pin bus (e.g., left-right enable (LREN[0],[1])). In another implementation, as illustrated in the example of FIG. 2, the two or more memory instances 220a, 220b may include first, second, third, and fourth memory instances 220a, 220b, 220c, 220d. In such an implementation, the first word-line decoder block 212 may be coupled to the first and second memory instances 220a, 220b, while the second word-line decoder block 214 may be coupled to the third and fourth memory instances 220c, 220d. Moreover, the pin bus 202 would be a four-pin bus (e.g., left-right enable (LREN <0:3>; LREN[0],[1],[2],[3])).

In certain aspects, the example integrated circuit 200 may further include two or more input/output circuits (i.e., I/O ports) (208a, 208b, etc.) respectively coupled to the at least two memory instances (220a, 220b, etc.). In various implementations, each of the I/O circuits 208a, 208b, etc. may include a respective write driver, sense amplifier, pre-charge circuit, multiplexer, and D input and Q output latches. In one example implementation, the two or more I/O ports include first and second I/O ports 208a, 208b. In such an example, the first and second I/O ports 208a, 208b are respectively coupled to first and second memory instances 220a, 220b. In another implementation, as shown in FIG. 2, the two or more I/O ports include first, second, third, and fourth I/O ports 208a, 208b, 208c, 208d that may be respectively coupled to the first, second, third, and fourth instances 220a, 220b, 220c, and 220d.

In certain implementations, each of the first and second word-line decoder blocks (circuitries) 212, 214 may include a word-line post decoder and driver circuits. In a particular case, the word-line decoder (circuitries) 212, 214 blocks may be configured to select word-lines coupled to the memory instances (120a, 120b, etc.) based on the control signals generated by the control block 110.

In certain schemes, with reference to FIG. 2, the control block circuitry 210 may be configured such that a user/programmer may access one or more memory instances 220 (e.g., 220a, 220b, etc.) and/or independent access by way of a particular address bit. In certain aspects, the control block circuitry 210 may include a first control section 232 including a first clock generation block 242, a second control section 234 including a second clock generation block 244, and a configuration control logic section 236. In one example, with two memory instances, 220a, 220b, the first control section 232 may be a control sub-block for both the memory instances 220a, 220b. In another example, as shown in FIG. 2, with four memory instances, 220a, 220b, 220c, 220d, the first control section 232 may be a control sub-block for the first and second memory instances 220a, 220b, while the second control section 234 may be a control sub-block for the third and fourth memory instances 220c, 220d.

In the implementation of circuit 100, as shown in FIG. 2, the control block circuitry 210 may include various input signals/lines including: a clock signal (Clk), a chip enable signal (CEN) and address pins 204 (AA0, AB0, (A<1:7>); e.g., one input address bus (AA0, AB0, A[1-7]) that can divide into AA[0-7] and AB[0-7] in the block 210), a supply voltage signal (vdd), a global write enable signal (GWEN), and a (left-right enable) selection signal on the pin bus 202 (LREN <0:3>). Moreover, as shown in FIG. 2, the control block circuitry 210 may also include output signals including: the GWEN and LREN <0,1> (input into the first and second memory instances 120a, 120b), and the GWEN and LREN <2,3> (input into the third and fourth memory instances 120c, 120d).

In this manner, in one particular operation, via the control block circuitry 210, the two or more memory instances (either two or four memory blocks 220a-b, 220a-d in different implementations) may be coupled and configured to be at least partially controlled by one or both of the common chip enable pin (CEN), address bus 204 (address pins (AA0, AB0, A<1:7>)) and the pin bus 202 (LREN <0:3>). Also, for such an operation, corresponding to a particular implementation with reference to FIG. 2, the common address bus (AA<0>, AB<0>, A<1:7>) may include nearly identical address pins that correspond to at least one different address bit (e.g., a single different address bit), where the nearly identical address pins (e.g., A<1:7>, with one address pin being different: AA<0>] (208), AB<0> (209)) comprise at least one pin coupled (e.g., AA<0>) to a first memory instance of the two or more memory instances and at least one pin (e.g., AB<0>) coupled to a second memory instance of the two or more memory instances (i.e., the same 7-bits with two bits being different (e.g., A<1:7> with either AA<0> going to Way 0 and Way 1 (i.e., the first and second memory instances 220a, 220b) or AB<0> going to Way 2 and Way 3 (i.e., the third and fourth memory instances 220c, 220d)).

Referring to FIG. 3, an example integrated circuit 300 (i.e., two or more memory macros including memory arrays (e.g., static-random access memory (SRAM)) implementable on a system-on chip (SoC), as collectively: the two or four LREN instance) is shown. As depicted in FIG. 3, the integrated circuit 300 may include first and second word-line decoder blocks (i.e., first and second word-line decoder circuitries) 312, 314, two or more memory instances 320a, 320b, etc. (i.e., two or four-memory core arrays, memory banks, memory blocks, 2 or 4 "Ways") and a control block circuitry (i.e., a central block) 310 coupled to the first and second word-line decoder blocks 312, 314 and the two or more memory instances 320a, 320b, etc. As shown, a pin bus 302 (i.e., either a two-pin or four-pin left-right enable (LREN) bus) (e.g., LREN<0:1>, LREN<0:3>) (e.g., selection signal on the LREN pin bus) enabled in the control block circuitry 310 may be configured to at least partially control selection (e.g., access) of one or more of the two or more memory instances 320a, 320b, etc. As illustrated in FIG. 3, in one implementation, a 4-way LREN bus 302 may be used to at least partially control selection of first, second, third, and fourth blocks 320a, 320b, 320c, and 320d.

Advantageously, as shown in one example illustration in FIG. 3, the two memory instances (e.g., 320a, 320b) or four memory instances (e.g., 320a, 320b, 320c, and 320d) may include first and second address buses 304, 305 (e.g., separate 8-pin (bit) address buses; AA<0:7>, AB<0:7>) that can be coupled and configured to at least partially control a two or four-way LREN combined-instance (i.e., the integrated circuit 300). Moreover, such a two or four-way LREN combined-instance may be a two-port (one read-one read/write (1R/1RW) instance). Accordingly, a first port (e.g., Port A) may be a read port and a second port (e.g., Port B) may be a read/write port. Such an integrated circuit 300 may provide a greater than 10% improvement in port A access timing, as well as 4% improvement in area.

In one implementation (not shown), the two or more memory instances 320a, 320b may include first and second memory instances 320a, 320b. In such an implementation, the first word-line decoder blocks (circuitries) 312 may be coupled to the first and second memory instances 320a, 320b. Moreover, the pin bus 302 would be a two-pin bus (e.g., left-right enable (LREN[0],[1])). In another implementation, as illustrated in the example of FIG. 3, the two or more memory instances 320a, 320b may include first, second, third, and fourth memory instances 320a, 320b, 320c, 320d. In such an implementation, the first word-line decoder block 312 may be coupled to the first and second memory instances 320a, 320b, while the second word-line decoder block 314 may be coupled to the third and fourth memory instances 320c, 320d. Moreover, the pin bus 302 would be a four-pin bus (e.g., left-right enable (LREN <0:3>; LREN [0],[1],[2],[3])).

In certain aspects, the example integrated circuit 300 may further include two or more input/output circuits (i.e., I/O ports) (308a, 308b, etc.) respectively coupled to the at least two memory instances (320a, 320b, etc.). In various implementations, each of the I/O circuits 308a, 308b, etc. may include a respective write driver, sense amplifier, pre-charge circuit, multiplexer, and D input and Q output latches. In one example implementation, the two or more I/O ports include first and second I/O ports 308a, 308b. In such an example, the first and second I/O ports 308a, 308b are respectively coupled to first and second memory instances 320a, 320b. In another implementation, as shown in FIG. 3, the two or more I/O ports include first, second, third, and fourth I/O ports 308a, 308b, 308c, 308d that may be respectively coupled to the first, second, third, and fourth instances 320a, 320b, 320c, and 320d.

In certain implementations, each of the first and second word-line decoder blocks (circuitries) 312, 314 may include a word-line post decoder and driver circuits. In a particular case, the word-line decoder blocks (circuitries) 312, 314 may be configured to select word-lines coupled to the memory instances (320a, 320b, etc.) based on the control signals generated by the control block 310.

In certain schemes, with reference to FIG. 3, the control block circuitry 310 may be configured for selecting read and write control access of one or more of the memory instances 320 (e.g., 320a, 320b, etc.) In certain aspects, the control block circuitry 310 may include a first control section 332 including a first clock generation block 342, a second control section 334 including a second clock generation block 344, and a configuration control logic section 336. In one example, with two memory instances, 320a, 320b, the first control section 332 may be a control sub-block for both the memory instances 320a,320b. In another example, as shown in FIG. 3, with four memory instances, 320a, 320b, 320c, 320d, the first control section 332 may be a control sub-block for the first and second memory instances 320a, 320b, while the second control section 334 may be a control sub-block for the third and fourth memory instance 320c, 320d.

In the implementation of circuit 300, as shown in FIG. 3, the control block circuitry 310 may include various input signals/lines including: a clock signal (Clk), first and second address buses 304, 305 (i.e., first and second chip enable signal (CENA, CENB) and address pins AA<0:7>, AB<0:7>), a supply voltage signal (vdd), a global write enable signal (GWENB, and a (left-right enable) selection signal on the pin bus 302 (LREN <0:3>). Moreover, as shown in FIG. 3, the control block circuitry 310 may also include output signals including: the GWENB and LREN <0,1> (input into Port A: the first and second memory instances 320a, 320b), and the GWENB and LREN <2,3> (input into Port B: the third and fourth memory instances 320c, 320d).

In this manner, in one particular operation, via the control block circuitry 310, the two or more memory instances (either two or four memory blocks 320a-b, 320a-d in different implementations) may be coupled and configured to be at least partially controlled by either the first address bus (AA<0:7>) or the second address bus (AB<0:7>) and the pin bus (LREN <0:3>). Moreover, a programmable pin (Prog_GWEN) enabled in the control block circuitry may also be configured to partially control at least one of read or write operations of the two or more memory instances (i.e., 310a-b, 310a-d). For instance, when GWENB=0 (where Prog_GWEN may be programmed to GWENB), gwen_select (i.e., the output signal of a buffer gate input to a multiplexer) is also 0. As such, this can enable a selected Port B address on Port A_int (i.e., the out of the multiplexer). Accordingly, a write operation would take place on the Port A for an AB address that would be used to write to each of the memory instances 320a-d. In contrast, when GWENB=1, the gwen_select is 1. As such, this can enable the Port A address on the PortA_int. Accordingly, a read operation would take place on the Port A for an AA address. Hence, for the integrated circuit 300, the GWENB may be used to the control write/read address of PortA.

Correspondingly, in one implementation, the first address bus (AA<0:7>) may be configured to at least partially control read access of the first and second memory instances, and the second address bus (AB<0:7>) may be configured to at least partially control read access of the third and fourth memory instances. Moreover, the second address bus (AB<0:7>) may be configured to at least partially control write access to each of the first, second, third, and fourth memory instances. Hence, in such an implementation, the first address bus (AA<0:7>) may be coupled to the first and second memory instances (i.e., Port A), while the second address bus (AB<0:7>) may be coupled to the second and third memory instances (i.e., Port B).

In other schemes and techniques of the inventive aspects as described in FIGS. 1-3, other circuit implementations are also envisioned. Also, the inventive aspects may use a combination of this macro section and other standard macros to reduce power, performance, area (PPA) constraints.

According to one implementation of the present disclosure, an integrated circuit includes first and second word-line decoder circuitry, two or more memory instances coupled to the first and second word-line decoder circuitry; and a control block circuitry coupled to the first and second word-line decoder circuitry and the at least two memory instances. Also, a pin bus enabled in the control block circuitry may be configured to at least partially control selection of one or more of the two or more memory instances.

In a first aspect, the integrated circuit further includes: two or more input/output circuits respectively coupled to the at least two memory instances, where each of the two or more input/output circuits includes a write driver, a sense amplifier, a pre-charge circuit, a multiplexer, and input and output latches.

In a second aspect, the two or more memory instances include first and second memory instances, and where the first word-line decoder circuitry is coupled to the first and second memory instances, and where the pin bus includes a two-pin bus.

In a third aspect, the two or memory instances include first, second, third, and fourth memory instances, and where the first word-line decoder circuitry is coupled to the first and second memory instances and the second word-line decoder circuitry is coupled to the third and fourth memory instances, and wherein the pin bus comprises a four-pin bus.

In a fourth aspect, further to the third aspect, respective input/output ports may be respectively coupled to each of the first, second, third, and fourth instances, and where each of the respective input/output circuits include a write driver, a sense amplifier, a pre-charge circuit, a multiplexer, and input and output latches.

In a fifth aspect, each of the two or more memory instances may be coupled and configured to be at least partially controlled by a common address bus.

In a sixth aspect, further to the fifth aspect, the common address bus may include identical address pins corresponding to identical address-bits or nearly identical address pins corresponding to at least one different address-bit, where the nearly identical address pins include at least one pin coupled to a first memory instance of the two or more memory instances and at least one pin coupled to a second memory instance of the two or more memory instances.

In a seventh aspect, each of the two or more memory instances may be coupled to and may be configured to be at least partially controlled by first and second address buses.

In an eighth aspect, further to the seventh aspect, a programmable pin enabled in the control block circuitry may be configured to partially control at least one of read or write operations of the two or more memory instances.

In a ninth aspect, further to the seventh aspect, the two or more memory instances may include first, second, third, and fourth memory instances, where the first word-line decoder circuitry may be coupled to the first and second memory instances and the second word-line decoder circuitry may be coupled to the third and fourth memory instances, and where the first address bus may be configured to at least partially control the first and second memory instances, and where the second address bus may be configured to control the third and fourth memory instances.

In a tenth aspect, further to the ninth aspect, the first and second memory instances may correspond to a first port, and where the third and fourth memory instances may correspond to a second port.

In an eleventh aspect, further to the tenth aspect, the first port may correspond to a read port, and where the second port may correspond to a read/write port.

In a twelfth aspect, further to the ninth aspect, the first address bus may be configured to at least partially control read access of the first and second memory instances, and where the second address bus may be configured to at least partially control read access of the third and fourth memory instances.

In a thirteenth aspect, further to the ninth aspect, the first address bus is configured to at least partially control read access of the first memory instance, and wherein the second address bus is configured to at least partially control read access to second memory instance.

In a fourteenth aspect, further to the ninth aspect, the second address bus may be configured to at least partially control write access to each of the first, second, third, and fourth memory instances.

In a fifteenth aspect, the control block circuitry may include internal clock generation circuitry.

In a sixteenth aspect, each of the first and second word-line decoder blocks includes word-line post decoder and driver circuitry.

According to one implementation of the present disclosure, an integrated circuit includes first and second word-line decoder circuitry; two or more memory instances coupled to the first and second word-line decoder circuitry; and a control block circuitry coupled to the first and second word-line decoder circuitry and the two or more memory instances, where a programmable pin enabled in the control block circuitry may be configured to partially control at least one of read or write operations of the two or more memory instances.

According to one implementation of the present disclosure, a system on chip includes: first and second word-line decoder circuitry; two or more memory instances coupled to the first and second word-line decoder circuitry; and a control block circuitry coupled to the first and second word-line decoder circuitry and the two or more memory instances, where a pin bus may be configured to at least partially control selection of one or more of the at least two memory instances.

In a first aspect, each of the two or more memory instances may be coupled to and configured to be at least partially controlled by first and second address buses.

In a second aspect, a programmable pin may be configured to partially control at least one of read or write operations of the two or more memory instances.

In example implementations, certain circuit elements have been provided in FIGS. 1-3, whose redundant description has not been duplicated in the related description of analogous circuit elements herein. It is expressly incorporated that the same circuit elements with identical symbols and/or reference numerals are included in each of embodiments based on its corresponding figure(s).

Although one or more of FIGS. 1-3 may illustrate systems, apparatuses, or methods according to the teachings of the disclosure, the disclosure is not limited to these illustrated systems, apparatuses, or methods. One or more functions or components of any of FIGS. 1-3 as illustrated or described herein may be combined with one or more other portions of another of FIGS. 1-3. Accordingly, no single implementation described herein should be construed as limiting and implementations of the disclosure may be suitably combined without departing form the teachings of the disclosure.

The block diagrams in the Figures illustrate the architecture, functionality, and operation of possible implementations of systems and methods according to various implementations of the present disclosure. In this regard, each block in the block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm utilized in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:
1. An integrated circuit:
first and second word-line decoder circuitry;
two or more memory instances coupled to the first and second word-line decoder circuitry; and
a control block circuitry coupled to the first and second word-line decoder circuitry and the two or more memory instances, wherein a pin bus enabled in the control block circuitry is configured to at least partially control selection of one or more of the two or more memory instances.

2. The integrated circuit of claim 1, further comprising:
two or more input/output circuits respectively coupled to the two or more memory instances, wherein each of the two or more input/output circuits comprise a write driver, a sense amplifier, a pre-charge circuit, a multiplexer, and input and output latches.

3. The integrated circuit of claim 1, wherein the two or more memory instances include first and second memory instances, and wherein the first word-line decoder blocks is coupled to the first and second memory instances, and wherein the pin bus comprises a two-pin bus.

4. The integrated circuit of claim 1, wherein the two or more memory instances include first, second, third, and fourth memory instances, and wherein the first word-line decoder circuitry is coupled to the first and second memory instances and the second word-line decoder circuitry is coupled to the third and fourth memory instances, and wherein the pin bus comprises a four-pin bus.

5. The integrated circuit of claim 4, further comprising:
respective input/output ports respectively coupled to each of the first, second, third, and fourth instances, and wherein each of the respective input/output circuits comprise a write driver, a sense amplifier, a pre-charge circuit, a multiplexer, and input and output latches.

6. The integrated circuit of claim 1, wherein each of the two or more memory instances is coupled and configured to be at least partially controlled by a common address bus.

7. The integrated circuit of claim 6, wherein the common address bus comprises identical address pins corresponding to identical address-bits or nearly identical address pins corresponding to at least one different address-bit, wherein the nearly identical address pins comprise at least one pin coupled to a first memory instance of the two or more memory instances and at least one pin coupled to a second memory instance of the two or more memory instances.

8. The integrated circuit of claim 1, wherein each of the two or more memory instances is coupled to and configured to be at least partially controlled by first and second address buses.

9. The integrated circuit of claim 8, wherein a programmable pin enabled in the control block circuitry is configured to partially control at least one of read or write operations of the two or more memory instances.

10. The integrated circuit of claim 8,
wherein the two or more memory instances include first, second, third, and fourth memory instances, wherein the first word-line decoder circuitry is coupled to the first and second memory instances and the second word-line decoder circuitry is coupled to the third and fourth memory instances,
wherein the first address bus is configured to at least partially control the first and second memory instances, and wherein the second address bus is configured to control the third and fourth memory instances.

11. The integrated circuit of claim 10, wherein the first and second memory instances correspond to a first port, and wherein the third and fourth memory instances correspond to a second port.

12. The integrated circuit of claim 11, wherein the first port corresponds to a read port, and wherein the second port corresponds to a read/write port.

13. The integrated circuit of claim 10, wherein the first address bus is configured to at least partially control read access of the first and second memory instances, and wherein the second address bus is configured to at least partially control read access of the third and fourth memory instances.

14. The integrated circuit of claim 10, wherein the second address bus is configured to at least partially control write access to each of the first, second, third, and fourth memory instances.

15. The integrated circuit of claim 1, wherein the control block circuitry comprises internal clock generation circuitry.

16. The integrated circuit of claim 1, wherein each of the first and second word-line decoder circuitry comprises word-line post decoder and driver circuitry.

17. An integrated circuit comprising:
first and second word-line decoder circuitry;
two or more memory instances coupled to the first and second word-line decoder circuitry;
a control block circuitry coupled to the first and second word-line decoder circuitry and the two or more memory instances, wherein a programmable pin enabled in the control block circuitry is configured to partially control at least one of read or write operations of the two or more memory instances.

18. A system on chip comprising:
first and second word-line decoder circuitry;
two or more memory instances coupled to the first and second word-line decoder circuitry; and
a control block circuitry coupled to the first and second word-line decoder circuitry and the two or more memory instances, wherein a pin bus is configured to at least partially control selection of one or more of the two or more memory instances.

19. The integrated circuit of claim 18, wherein each of the two or more memory instances is coupled to and configured to be at least partially controlled by first and second address buses.

20. The integrated circuit of claim 19, wherein a programmable pin is configured to partially control at least one of read or write operations of the two or more memory instances.

* * * * *